(12) United States Patent
Faraoni et al.

(10) Patent No.: US 11,024,378 B2
(45) Date of Patent: **\*Jun. 1, 2021**

(54) MEMORY SYSTEMS AND MEMORY PROGRAMMING METHODS

(71) Applicant: Micron Technology, Inc., Boise, ID (US)

(72) Inventors: Emiliano Faraoni, Boise, ID (US); Scott E. Sills, Boise, ID (US); Alessandro Calderoni, Boise, ID (US); Adam Johnson, Meridian, ID (US)

(73) Assignee: Micron Technology , Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/176,417

(22) Filed: Oct. 31, 2018

(65) Prior Publication Data

US 2019/0074060 A1 Mar. 7, 2019

Related U.S. Application Data

(63) Continuation of application No. 15/050,248, filed on Feb. 22, 2016, now Pat. No. 10,147,486, which is a
(Continued)

(51) Int. Cl.
*G11C 13/00* (2006.01)

(52) U.S. Cl.
CPC ...... *G11C 13/0064* (2013.01); *G11C 13/0011* (2013.01); *G11C 13/0069* (2013.01);
(Continued)

(58) Field of Classification Search
CPC . G11C 11/16; G11C 13/0069; G11C 13/0064; G11C 13/0011;
(Continued)

(56) References Cited

U.S. PATENT DOCUMENTS

| 5,211,434 A | 5/1993 | Lanava |
| 5,268,863 A * | 12/1993 | Bader ...................... G11C 8/18 365/189.16 |

(Continued)

*Primary Examiner* — Michael T Tran
(74) *Attorney, Agent, or Firm* — Wells St. John P.S.

(57) ABSTRACT

Memory systems and memory programming methods are described. According to one arrangement, a memory system includes a memory array comprising a plurality of memory cells individually configured to have a plurality of different memory states, access circuitry configured to apply signals to the memory cells to program the memory cells to the different memory states, and a controller to configured to control the access circuitry to apply a first of the signals to one of the memory cells to program the one memory cell from a first memory state to a second memory state different than the first memory state, to determine that the one memory cell failed to place into the second memory state as a result of the application of the first signal, and to control the access circuitry to apply a second signal to the one memory cell to program the one memory cell from the first memory state to the second memory state as a result of the determination, wherein the first and second signals have a different electrical characteristic.

27 Claims, 14 Drawing Sheets

Related U.S. Application Data continuation of application No. 14/151,729, filed on Jan. 9, 2014, now Pat. No. 9,269,432.

(52) U.S. Cl.
CPC ........... *G11C 2013/0066* (2013.01); *G11C 2013/0071* (2013.01); *G11C 2013/0073* (2013.01); *G11C 2013/0092* (2013.01); *G11C 2213/79* (2013.01)

(58) Field of Classification Search
CPC .... G11C 2013/0071; G11C 2013/0073; G11C 2013/0092; G11C 2213/79; G11C 2013/0066
USPC .................................................. 365/148, 158
See application file for complete search history.

(56) References Cited

U.S. PATENT DOCUMENTS

| | | | |
|---|---|---|---|
| 5,602,789 A * | 2/1997 | Endoh | G11C 11/5621 365/185.03 |
| 5,953,255 A * | 9/1999 | Lee | G11C 11/5628 365/185.28 |
| 6,137,716 A * | 10/2000 | Wik | G11C 11/5621 365/104 |
| 6,252,795 B1 | 6/2001 | Hansen et al. | |
| 6,381,670 B1 | 4/2002 | Lee et al. | |
| 6,392,916 B1 | 5/2002 | Choi et al. | |
| 6,396,738 B1 * | 5/2002 | Tamada | G11C 16/3454 365/185.19 |
| 6,496,417 B1 | 12/2002 | Shiau et al. | |
| 6,529,038 B2 | 3/2003 | Lambertson | |
| 6,714,457 B1 * | 3/2004 | Hsu | G11C 11/5628 365/185.03 |
| 6,773,842 B2 * | 8/2004 | Liu | H01M 2/1223 429/407 |
| 6,879,525 B2 | 4/2005 | Van Brocklin et al. | |
| 7,006,384 B2 | 2/2006 | Banks | |
| 7,028,240 B1 | 4/2006 | Bautista et al. | |
| 7,042,045 B2 * | 5/2006 | Kang | H01L 21/28185 257/321 |
| 7,130,210 B2 | 10/2006 | Bathul et al. | |
| 7,200,064 B1 | 4/2007 | Boerstler et al. | |
| 7,206,225 B2 * | 4/2007 | Wu | G11C 11/5628 365/185.03 |
| 7,593,259 B2 * | 9/2009 | Kim | G11C 11/5628 365/185.03 |
| 7,630,245 B2 * | 12/2009 | Kikuchi | G11C 16/10 365/185.03 |
| 7,679,980 B2 | 3/2010 | Happ et al. | |
| 7,796,421 B2 | 9/2010 | Mani | |
| 7,830,718 B2 * | 11/2010 | Sarin | G11C 16/3418 365/185.13 |
| 7,944,730 B2 * | 5/2011 | Chen | G11C 11/16 365/148 |
| 8,154,904 B2 | 4/2012 | Sekar et al. | |
| 8,213,259 B2 | 7/2012 | Reed | |
| 8,271,855 B2 | 9/2012 | Norman | |
| 8,279,675 B2 * | 10/2012 | Lee | G11C 11/5628 365/185.12 |
| 8,331,127 B2 | 12/2012 | Chen | |
| 8,392,683 B1 * | 3/2013 | Confalonieri | G06F 12/0246 711/163 |
| 8,411,503 B2 * | 4/2013 | Lee | G11C 11/5628 365/185.03 |
| 8,446,776 B2 | 5/2013 | Hwang et al. | |
| 8,467,226 B2 | 6/2013 | Bedeschi et al. | |
| 8,644,060 B2 | 2/2014 | Abedifard et al. | |
| 8,830,753 B2 * | 9/2014 | Kim | G11C 16/0483 365/185.08 |
| 8,830,763 B2 | 9/2014 | Seo | |
| 8,836,004 B2 * | 9/2014 | Huang | H01L 29/792 257/314 |
| 8,850,102 B2 * | 9/2014 | Hanhimaki | G11C 16/10 711/103 |
| 8,854,872 B2 * | 10/2014 | Lam | G11C 11/5628 365/148 |
| 8,879,318 B2 * | 11/2014 | Ahn | G11C 16/3459 365/185.03 |
| 8,897,075 B2 * | 11/2014 | Choi | G11C 16/10 365/185.18 |
| 8,917,550 B2 | 12/2014 | Lee | |
| 8,923,056 B2 | 12/2014 | Kim | |
| 8,934,298 B2 * | 1/2015 | Park | G11C 11/5628 365/185.03 |
| 8,934,304 B2 | 1/2015 | Cho et al. | |
| 8,971,088 B1 | 3/2015 | Jo et al. | |
| 8,995,167 B1 | 3/2015 | Kim et al. | |
| 9,013,934 B2 | 4/2015 | Lee | |
| 9,064,580 B2 * | 6/2015 | Senoo | G11C 16/20 |
| 9,123,414 B2 | 9/2015 | Kitagawa et al. | |
| 9,183,911 B2 | 11/2015 | Alam | |
| 9,208,874 B2 | 12/2015 | Lee et al. | |
| 9,230,685 B2 | 1/2016 | Strand et al. | |
| 9,269,432 B2 | 2/2016 | Faraoni et al. | |
| 9,336,875 B2 | 5/2016 | Fackenthal et al. | |
| 9,484,097 B2 * | 11/2016 | Kim | G11C 11/5628 |
| 9,633,728 B2 | 4/2017 | Kitagawa et al. | |
| 9,773,551 B2 | 9/2017 | Strand et al. | |
| 9,837,151 B2 | 12/2017 | Fackenthal et al. | |
| 10,121,539 B2 | 11/2018 | Kitagawa et al. | |
| 10,147,486 B2 | 12/2018 | Faraoni et al. | |
| 10,176,868 B2 | 1/2019 | Kitagawa et al. | |
| 10,304,531 B2 | 5/2019 | Strand et al. | |
| 10,311,953 B2 | 6/2019 | Fackenthal et al. | |
| 10,770,143 B2 | 9/2020 | Kitagawa et al. | |
| 2005/0024938 A1 * | 2/2005 | Ono | G11C 11/5628 365/185.14 |
| 2006/0245262 A1 * | 11/2006 | Li | G11C 16/10 365/185.28 |
| 2008/0080238 A1 | 4/2008 | Yuda | |
| 2008/0165571 A1 * | 7/2008 | Lung | G11C 11/5678 365/163 |
| 2008/0198673 A1 * | 8/2008 | Fujita | G11C 11/404 365/189.11 |
| 2009/0129140 A1 * | 5/2009 | Kawazoe | G11C 13/0007 365/148 |
| 2010/0061166 A1 * | 3/2010 | Tan | G11C 29/02 365/194 |
| 2011/0001551 A1 * | 1/2011 | Abou-Khalil | H01L 45/085 327/525 |
| 2011/0235420 A1 * | 9/2011 | Sharon | G11C 11/5642 365/185.17 |
| 2011/0267895 A1 * | 11/2011 | Lee | G11C 11/5628 365/185.25 |
| 2012/0120711 A1 | 5/2012 | Rabkin et al. | |
| 2012/0131400 A1 | 5/2012 | Rey-Losada | |
| 2012/0230085 A1 | 9/2012 | Kawai et al. | |
| 2012/0236624 A1 | 9/2012 | Costa et al. | |
| 2012/0320656 A1 * | 12/2012 | Chung | G11C 11/56 365/96 |
| 2013/0021845 A1 * | 1/2013 | Eleftheriou | G11C 13/0004 365/163 |
| 2013/0028021 A1 * | 1/2013 | Sharon | G11C 11/5642 365/185.17 |
| 2013/0044535 A1 * | 2/2013 | Shimakawa | G11C 7/14 365/148 |
| 2013/0148409 A1 | 6/2013 | Chung | |
| 2013/0163322 A1 * | 6/2013 | Lam | G11C 13/0069 365/163 |
| 2013/0250657 A1 | 6/2013 | Haukness et al. | |
| 2013/0201750 A1 | 8/2013 | Lee et al. | |
| 2013/0223131 A1 * | 8/2013 | Takagi | G11C 13/0064 365/148 |
| 2013/0250654 A1 | 9/2013 | Sugimae et al. | |
| 2013/0286710 A1 * | 10/2013 | Hall | G11C 17/18 365/96 |
| 2013/0294165 A1 * | 11/2013 | Park | G11C 16/04 365/185.17 |

(56) References Cited

U.S. PATENT DOCUMENTS

| | | | |
|---|---|---|---|
| 2013/0336069 A1* | 12/2013 | Kim | G11C 16/3459 365/185.19 |
| 2014/0003120 A1* | 1/2014 | Liao | G11C 17/16 365/96 |
| 2014/0009997 A1* | 1/2014 | Toda | G11C 13/0023 365/148 |
| 2014/0078811 A1* | 3/2014 | Kawai | G11C 13/0069 365/148 |
| 2014/0112054 A1 | 4/2014 | Shimakawa et al. | |
| 2014/0149824 A1* | 5/2014 | Ordentlich | G06F 11/10 714/763 |
| 2015/0179256 A1 | 6/2015 | Kitagawa et al. | |
| 2015/0194212 A1 | 7/2015 | Faraoni et al. | |
| 2016/0172031 A1 | 6/2016 | Faraoni et al. | |
| 2018/0197606 A1* | 7/2018 | Di Vincenzo | G11C 13/0064 |
| 2019/0279714 A1 | 9/2019 | Fackenthal et al. | |
| 2020/0321043 A1* | 10/2020 | Em | G11C 11/5642 |
| 2020/0326880 A1* | 10/2020 | Akel | G06F 3/0604 |
| 2020/0327938 A1* | 10/2020 | Xue | G11C 13/0069 |
| 2020/0335163 A1* | 10/2020 | Jung | G11C 13/0069 |

\* cited by examiner

MEMORY SYSTEMS AND MEMORY PROGRAMMING METHODS

RELATED PATENT DATA

This application is a continuation of and claims priority to U.S. patent application Ser. No. 15/050,248, filed Feb. 22, 2016, now U.S. Pat. No. 10,147,486, which is a continuation of and claims priority to U.S. patent application Ser. No. 14/151,729, filed Jan. 9, 2014, now U.S. Pat. No. 9,269,432, the teachings of which are incorporated herein by reference.

TECHNICAL FIELD

Embodiments disclosed herein pertain to memory systems and memory programming methods.

BACKGROUND

Memory devices are widely used in electronic devices, such as digital cameras and personal audio players, for storing digital data. Many different types of memory are available, each using a different fundamental technology for storing data, and the memory may be volatile or non-volatile memory. Resistive random-access memory (RRAM), conductive-bridge random-access memory (CBRAM) and flash are examples of non-volatile memory.

Referring to FIG. 1, plural conventional waveforms 1, 2 are shown wherein waveform 1 indicates voltages applied to a gate of an access transistor to implement set and reset operations and waveform 2 indicates voltages across a memory cell to implement set and reset operations. More specifically, the pulses of waveforms 1, 2 at time t=0 implement a set operation, the pulses of waveforms 1, 2 at times t=1, 3, 5, and 7 implement a reset operation and the pulses of waveforms 1, 2 at times t=2, 4, 6, and 8 implement a verify operation.

In some instances, a memory cell may fail to place in the reset state following the application of an original reset pulse (e.g., time t=1) as determined by a respective subsequent verification operation. In such a situation, subsequent reset pulses may be applied to the memory cells having the same current as the original reset pulse until the memory cell places in the reset state.

At least some embodiments are directed towards improved memory systems and memory programming methods as described further below.

DETAILED DESCRIPTION OF EXAMPLE EMBODIMENTS

Figure 1:
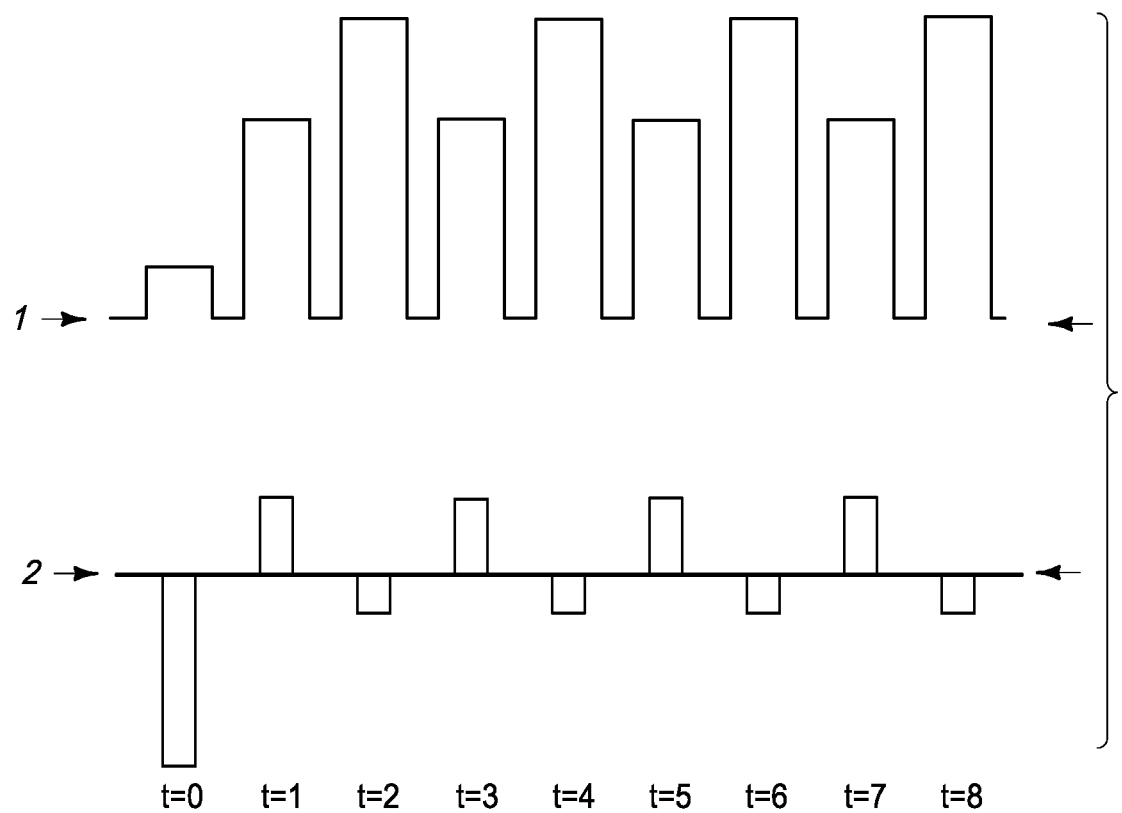
FIG. 1 is a graphical representation of conventional waveforms utilized to program a memory cell.
Figure 2:
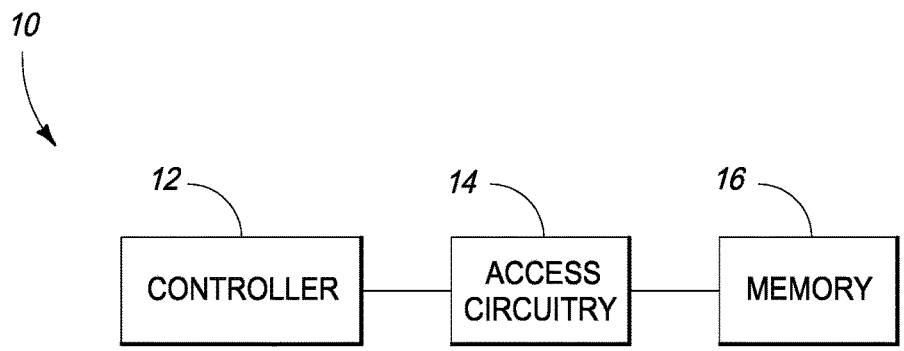
FIG. 2 is a functional block diagram of a memory system according to one embodiment.

Referring to FIG. 2, a functional block diagram of a memory system 10 is shown according to one embodiment. The illustrated memory system 10 includes a controller 12, access circuitry 14, and memory 16. Memory system 10 may be implemented within or with respect to various associated devices (not shown), such as computers, cameras, media players, and thumb drives, in some examples. Memory system 10 stores data generated or utilized by the associated devices in the described examples. Other embodiments of memory system 10 are possible and may include more, less and/or alternative components or circuitry.

Controller 12 controls operations of writing, reading and re-writing data of memory 16 as well as interfacing with other components or circuitry, such as sources of data to be stored within memory 16. Controller 12 may access and process commands with respect to memory 16 during operations of an associated device. Example commands instruct the generation of reset and set voltage potentials which are applied to memory 16 in one embodiment. The set and reset operations are used to write data to memory (i.e., program the memory) and are both referred to as write operations in one embodiment. Controller 12 may also control the application of read and verify pulses to memory 16 to read and verify stored data in one embodiment.

In one embodiment, controller 12 is configured to process data, control data access and storage, issue commands, and control other desired operations. Controller 12 may comprise processing circuitry configured to execute programming provided by appropriate computer-readable storage media (e.g., memory) in at least one embodiment. For example, the controller 12 may be implemented as one or more processor(s) and/or other structure configured to execute executable instructions including, for example, software and/or firmware instructions. Other example embodiments of controller 12 may include hardware logic, PGA, FPGA, ASIC, state machines, and/or other structures alone or in combination with one or more processor(s). These examples of controller 12 are for illustration and other configurations are possible.

Access circuitry 14 is coupled with controller 12 and memory 16 and is configured to implement addressing (selection of columns and rows of memory 16), writing, reading, verifying and re-writing operations with respect to memory cells of memory 16 in one embodiment. For example, access circuitry 14 may receive instructions from controller 12 to select a specific block, page, word or byte of the memory 16 as well as to implement writing, reading, verifying and re-writing with respect to a plurality of cells of the selected block, page, word or byte. As discussed below, the access circuitry 14 may apply electrical voltage potentials to the memory 16 to perform write, read and verification operations in one embodiment.

Memory 16 includes a plurality of memory cells configured to store data, conductors electrically connected with the memory cells, and perhaps additional circuitry, for example circuits of the access circuitry 14. At least some of the memory cells are individually capable of being programmed to a plurality of different memory states at a plurality of moments in time. Memory 16 is accessible to the user and/or associated device for storage of digital information. The memory cells may be configured as non-volatile cells in some implementations and may have different electrical resistances corresponding to different memory states. In one specific example implementation, memory 16 is implemented as conductive bridge random access memory (CBRAM) and the memory cells are conductive bridge memory cells.

Memory 16 may be implemented in different arrangements in different embodiments. For example, the memory 16 may be implemented within a memory device, such as a chip, a portion of the chip (e.g., tiles and/or sub-tiles discussed below) or other arrangements. The memory device may also include controller 12 and/or access circuitry 14 or portions thereof.

Figure 3:
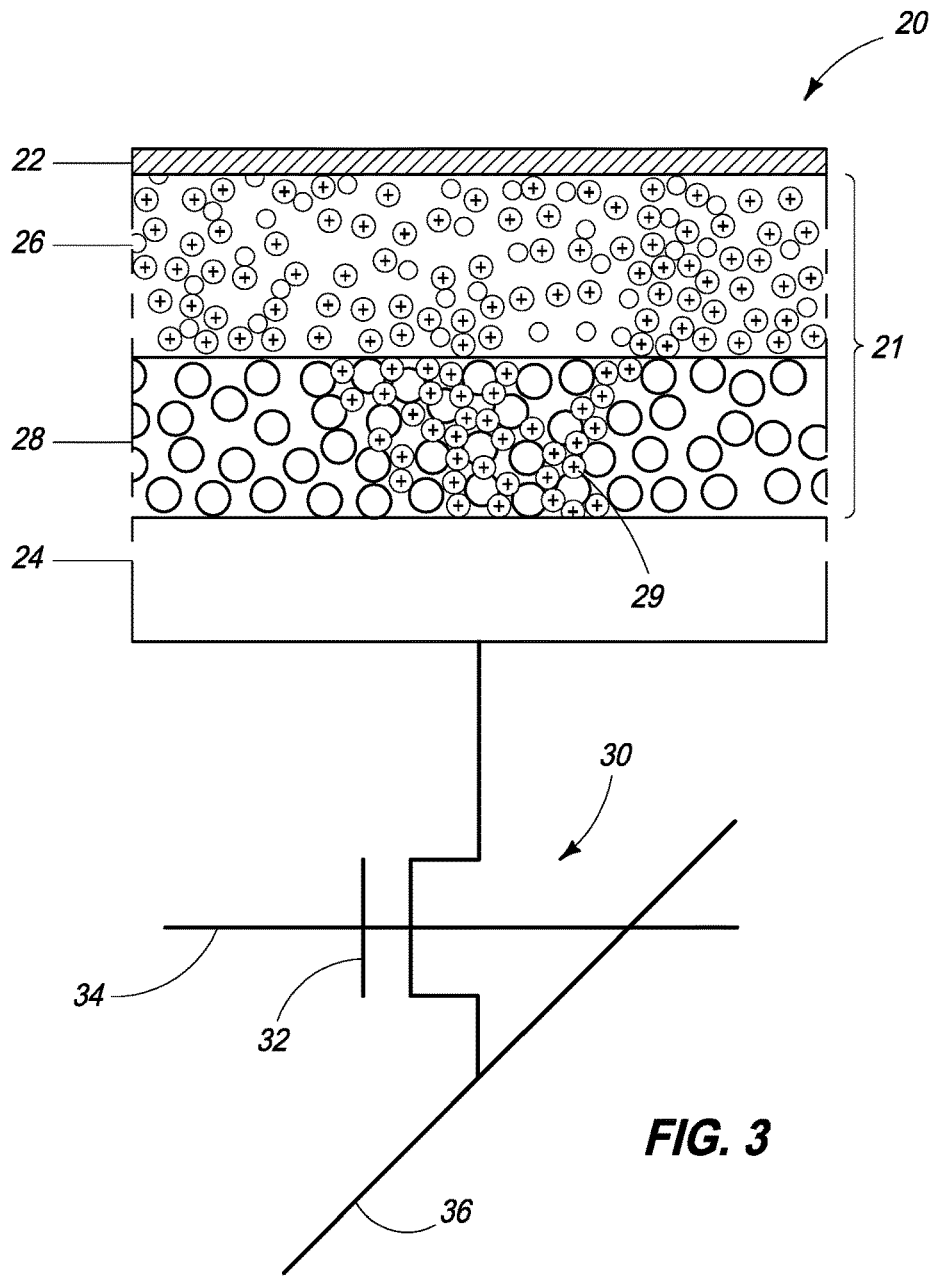
FIG. 3 is an illustrative representation of a memory cell according to one embodiment.

Referring to FIG. 3, an example of a memory cell 20 of memory 16 is shown. The illustrated example memory cell 20 is a one transistor/one resistor (1T1R) CBRAM memory cell. Other types of memory cells may be utilized in other embodiments.

The example memory cell 20 includes a first electrode 22, memory element 21 and second electrode 24, and the electrodes 22, 24 comprise electrically conductive material. The illustrated embodiment of memory element 21 includes an electrically conductive source member or layer 26 and a dielectric layer 28 intermediate the electrodes 22, 24. In one embodiment, the source layer 26 is a Cu+ source layer (e.g., CuTe), example materials of the dielectric layer 28 include AlOx, HfOx, and ZrOx, and the bottom electrode 24 is titanium nitride (TiN). Other embodiments are possible. Electrode 22 may be coupled with or part of a conductive common source line or plate.

The memory cell 20 shown in FIG. 3 includes one or more conductive structures 29 (e.g., filaments) in a low resistance state which may correspond to one of a plurality of different memory states (e.g., a "one" or "zero" in an example binary application) of the memory cell 20. The memory cell 20 may also be programmed to a high resistance state where the conductive structures 29 are removed and not present and which may correspond to another of the different memory states. Different write voltage potentials may be applied across the bottom electrodes 22, 24 to change the resistance (and memory state) of the memory cell 20.

More specifically, a set programming operation may be performed by the application of a voltage potential/bias to electrode 22 which is more positive than the voltage potential/bias applied to electrode 24. The application of these signals causes inducement of Cu ions into dielectric layer 28 and formation of one or more electrically conductive structures 29 (e.g., filaments) through dielectric layer 28 and between conductive source layer 26 and electrode 24. The formation of the structures 29 provides the memory cell 25 in a low resistance state. In one embodiment, the structures 29 comprise material (e.g., copper) from the source layer 26.

A memory cell 20 having the conductive structures 29 may be programmed in a reset operation to a high resistance state by the application of a voltage potential/bias to electrode 24 which is more positive than the voltage potential/bias applied to electrode 22. The application of these signals cause Cu ions to return into source layer 26 and dissolves any electrically conductive structures 29 within dielectric layer 28, thereby increasing the electrical resistance of the memory element 21 between the electrodes 22, 24 and providing the memory cell 20 in a high resistance state.

Memory cell 20 being may be repeatedly written between the high and low resistance arrangements at different moments in time to store different data values corresponding to the different memory (e.g., resistive) states. In one embodiment, a current is passed through the memory cell 22 and sense circuitry may measure the current to determine the resistance and memory state of the memory cell 20.

FIG. 3 also illustrates an access transistor 30 (e.g., NMOS) having a gate 32 coupled with a word line 34 and plural terminals coupled with electrode 24 and a bit line 36. Word line 34 is used to select the memory cell 20 for reading/writing/verification and bit line 36 is used to conduct appropriate signals for the reading/writing/verification of the memory cell 20. Access transistor 30 may be part of access circuitry 14 in one embodiment.

Figure 4:
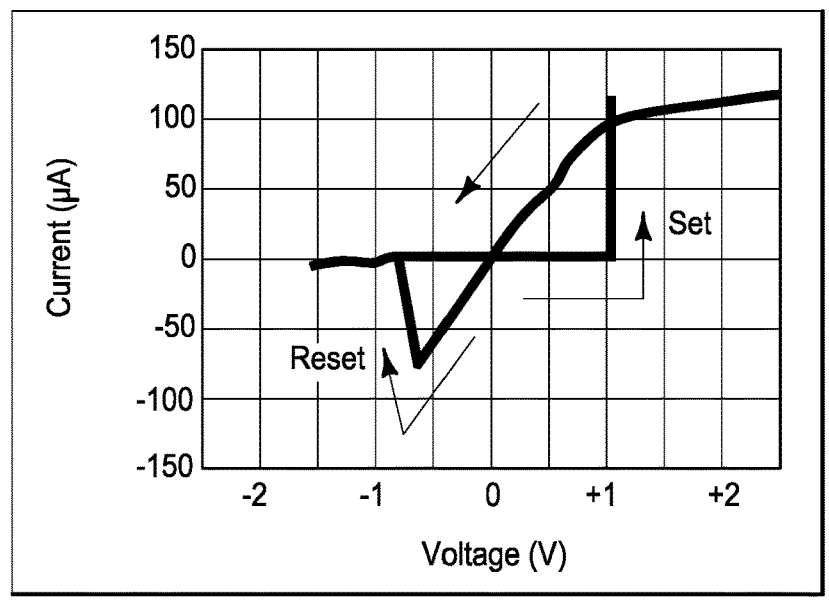
FIG. 4 is a graphical representation of plural memory states of a memory cell according to one embodiment.

FIG. 4 illustrates an IV curve of an example 50 nm CBRAM memory cell 20 in a voltage sweeping mode wherein the voltage polarity across the cell in a set/reset operation is defined as plus/minus, respectively. As shown, the memory cell is provided in a high resistive state (HRS) during a reset operation and is provided in a low resistive state (LRS) during a set operation.

Figure 5:
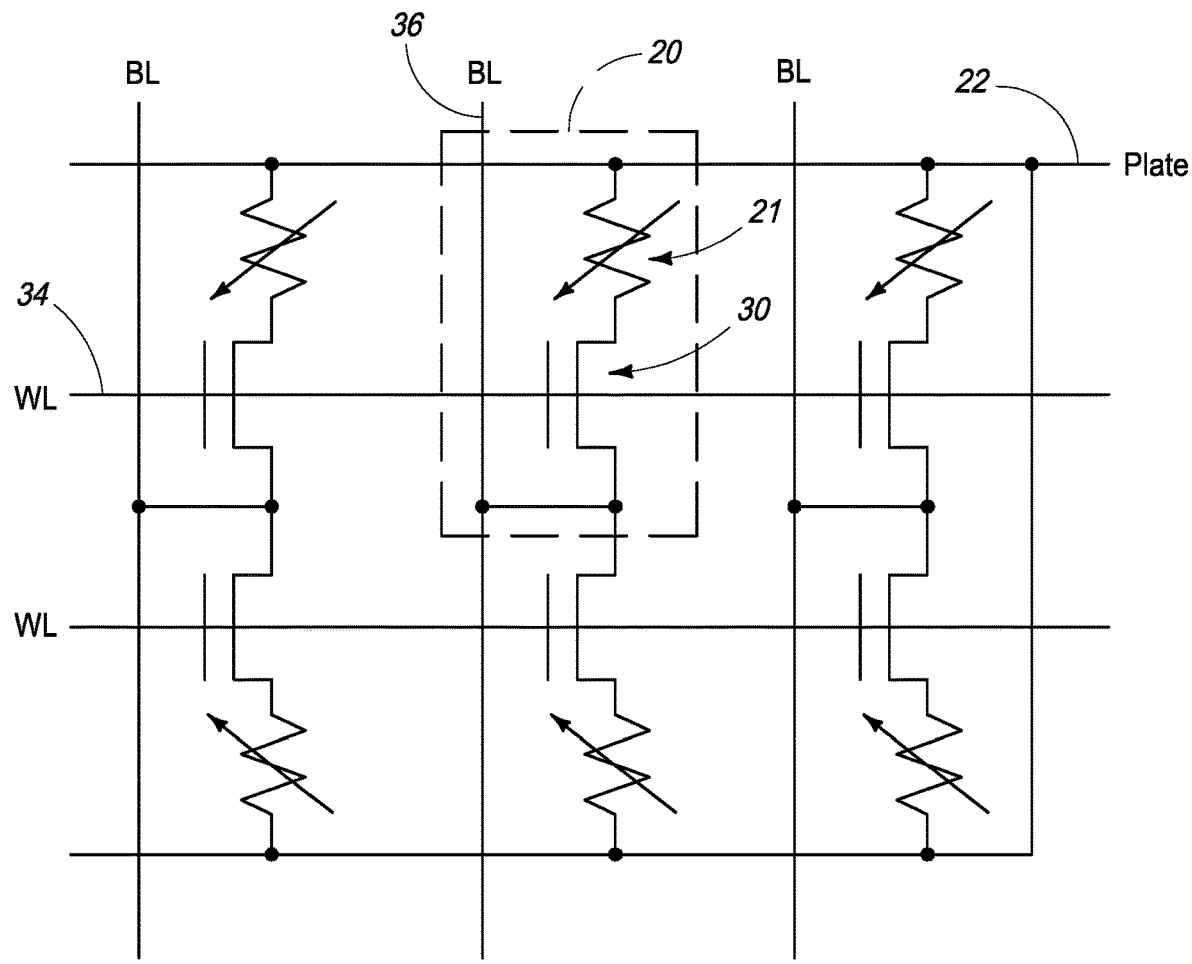
FIG. 5 is a schematic representation of a plurality of memory cells according to one embodiment.

Referring to FIG. 5, a plurality of memory cells 20 are coupled with a plurality of bitlines 36, wordlines 34, and plate electrode 22. Other arrangements of the memory cells 20 are possible.

Figure 6:
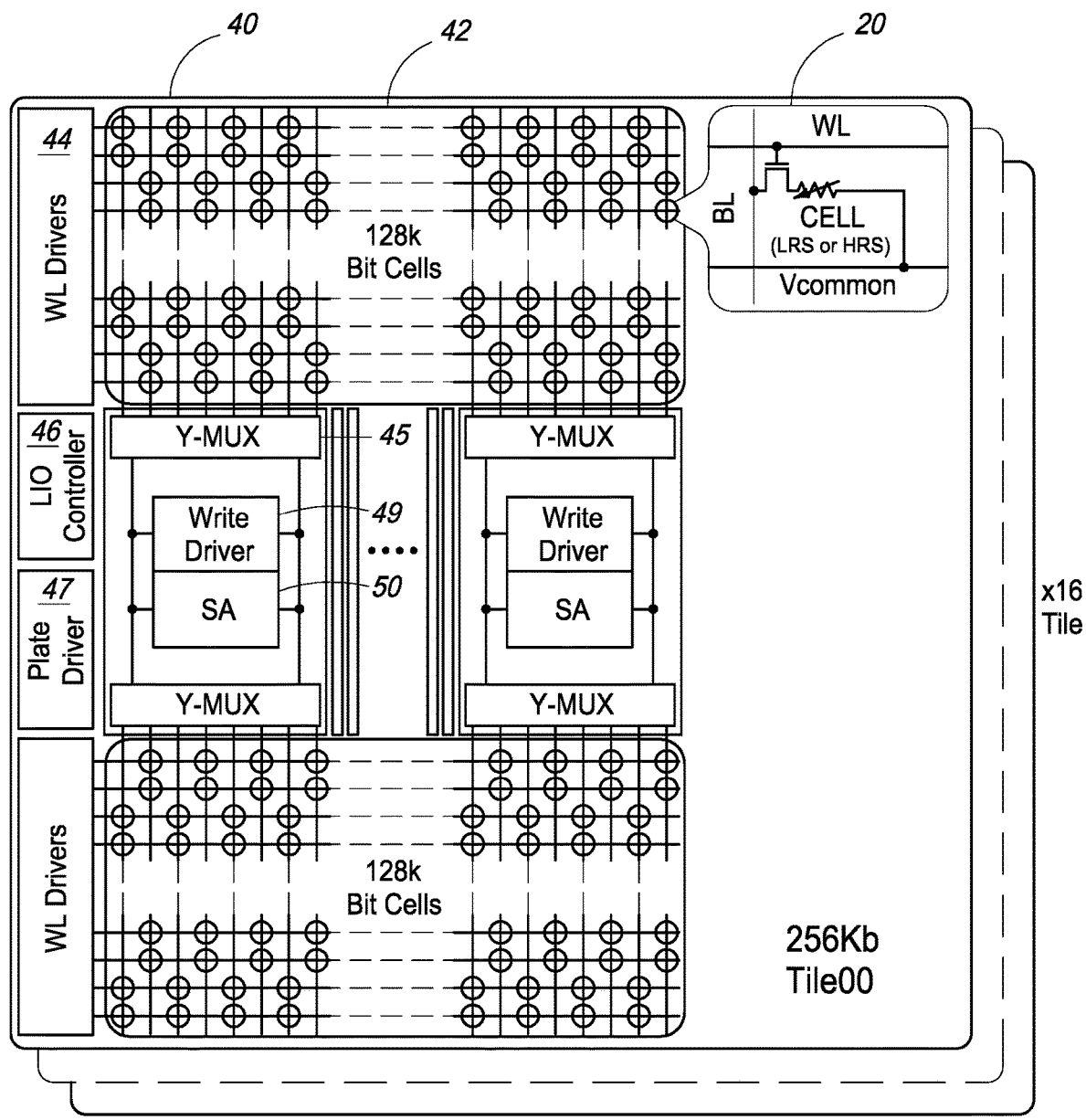
FIG. 6 is an illustrative representation of a tile of a memory chip according to one embodiment.

Referring to FIG. 6, a tile 40 of a memory device is shown according to one embodiment. The memory device may comprise a memory chip in one embodiment and which may include a plurality of tiles 40 (e.g., 16 tiles in the illustrated example).

The depicted tile 40 includes a memory array 42 of a plurality of memory cells 20 which may be individually addressed by WL drivers 44 and Y-MUX circuitry 45. The tile 40 additionally includes an LIO controller 46, Vcommon driver 47, write driver 49 and a sense amplifier 50 in the illustrated embodiment. Tile 40 includes sixty-four of individual circuits 48, 49 and 50 to interface with a plurality of memory cells 20 of array 42 in parallel in one embodiment. LIO controller 46 provides interfacing of the sense amplifiers 50 of a given bank of the tile 40 to a databus (not shown) which is shared between multiple banks and also interfaces with an I/O block of the memory chip. Plate driver 47 drives the plate voltage to the various voltage values utilized for reading and writing. The write driver 49 drives the bitline voltage to the various voltage values utilized for writing. Sense amplifiers 50 sense the memory states of memory cells 20 during read and verification operations.

Figure 7:
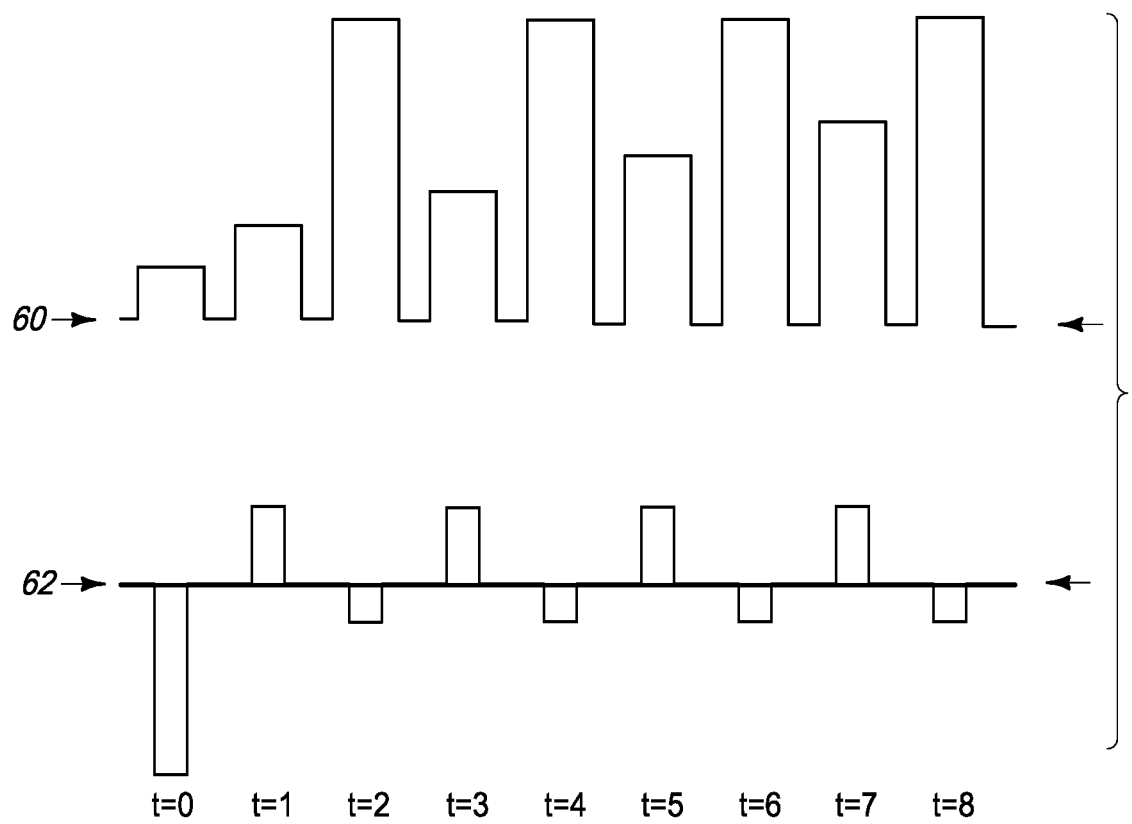
FIG. 7 is a graphical representation of waveforms utilized to program a memory cell according to one embodiment.

Referring to FIG. 7, waveforms 60, 62 include a plurality of signals or pulses which may be used to implement set and reset programming operations as well as verify operations in one embodiment and are shown against time which progress from left to right. Waveform 60 represents positive voltage potentials (bias or control signals) applied to gate 32 of access transistor 30 and waveform 62 represents voltage potentials applied to bit line 36 relative to electrode 22 of the memory cell 20 of FIG. 3.

In FIG. 7, the pulses of waveforms 60, 62 at time t=0 implement a set programming operation where the voltage of electrode 22 is higher than bit line 36 and may be referred to as set pulses or signals. The pulses of waveforms 60, 62 at times t=1, 3, 5, and 7 implement a reset programming operation and may be referred to as reset pulses or signals, and the pulses of waveforms 60, 62 at times t=2, 4, 6, and 8 implement verify programming operations and may be referred to as verify pulses or signals. For the reset programming operation, the bit line 36 is provided at a higher voltage potential than the electrode 22 during application of the reset pulses or signals.

Once a memory cell has been programmed to the set state (e.g., at time t=0), it may thereafter be reprogrammed to the reset state. The reset pulses applied to implement the programming operation to the reset state may have different electrical characteristics in some embodiments. In the example embodiment shown in FIG. 7, the reset pulses have increasing voltage potentials as time progresses to the right and which result in the application of reset pulses or signals of increasing electrical current to the memory cell 20 and increasing voltage potentials across the memory cell 20.

In one embodiment, and as discussed in additional detail below, it is desired to use a minimal current which is needed to change the programming from the set state to the reset state to extend endurance of the memory cells. Accordingly, the first pulse of waveform 60 corresponding to time t=1 is configured to generate the minimal current to attempt to change the programming to the reset state. As mentioned above, the pulses of waveform 60 are applied to the gate of access transistor 30 and bias the access transistor 60 to provide desired current to the memory element 21 in an attempt to program the memory element 21. The application of the pulse at time t=1 to the gate 32 results in the application of a signal having minimal current to the memory element 21.

However, the minimal current may not successfully place the memory cell 20 in the reset state as determined by a verification operation at time t=2. In one embodiment, the subsequent pulses of waveform 60 are configured to result in the application of respective signals of increasing current to the memory element 21 until a verification operation determines that the memory cell 20 properly placed in the reset state. Following verification of a proper reset placement, the programming operation to the reset state may be ceased with respect to the placed memory cell 20.

In one embodiment, the application of a plurality of pulses of waveforms 60 to gate 32 at a plurality of moments in time to generate a plurality of corresponding programming signals or pulses having increasing current which are applied to the memory cell 20 may be referred to as a single reset programming operation. In one embodiment, controller 12 is configured to implement the programming and verification operations including controlling the word line drivers 44 to increase the voltages of the word line signals applied to the access transistors 30 of memory cells 20 which failed to place in the reset state.

In one embodiment, the reset programming operation including applying the increasing programming currents is ceased with respect to memory cells 20 after the cells 20 have successfully placed into the reset state. Accordingly, in one embodiment, the memory cells 20 which have been properly placed into the reset state are isolated and no longer receive the reset program signals while others of the memory cells 20 which failed to place into the reset state may continue to receive the reset program signals of increasing current.

As mentioned above, the minimal current is used to program a memory cell to a reset state in one embodiment to extend endurance of the memory cells. However, if the minimal current is not successful in resetting a memory cell, the current can be increased or ramped a plurality of times until the memory cell is placed in the reset state.

CBRAM memory cells drift to higher reset current over time as a result of cycling and some cells may drift to a point where the memory system is incapable of providing sufficient current to program the cells from the set state to the reset state and the cells fail. The endurance of the memory array is limited by these reset (HRS) fails.

In one described embodiment, the current applied to the memory cell may be ramped or increased and which may successfully program the memory cells to the reset state which otherwise would have remained stuck in the set state. Furthermore, the use of a minimal current at the onset in accordance with one embodiment provides that the memory cells are programmed using minimal currents for successful programming which may slow the drifting of the memory cells to needing higher currents to be successfully reset inasmuch as the use of higher than necessary currents may increase the drifting of the memory cells to use of higher reset currents for proper programming. Accordingly, at least some of the embodiments slow the drifting of memory cells to higher reset current and provide increased current when needed in order to continue cycling while avoiding use of excess current which results in an extension in endurance of the memory array.

Although example embodiments are described with respect to CBRAM memory, the described may also be applied to other types of memory including other non-volatile resistive random-access memory (RRAM), for example, which rely upon atomic displacements for changing memory state.

Figure 8A:
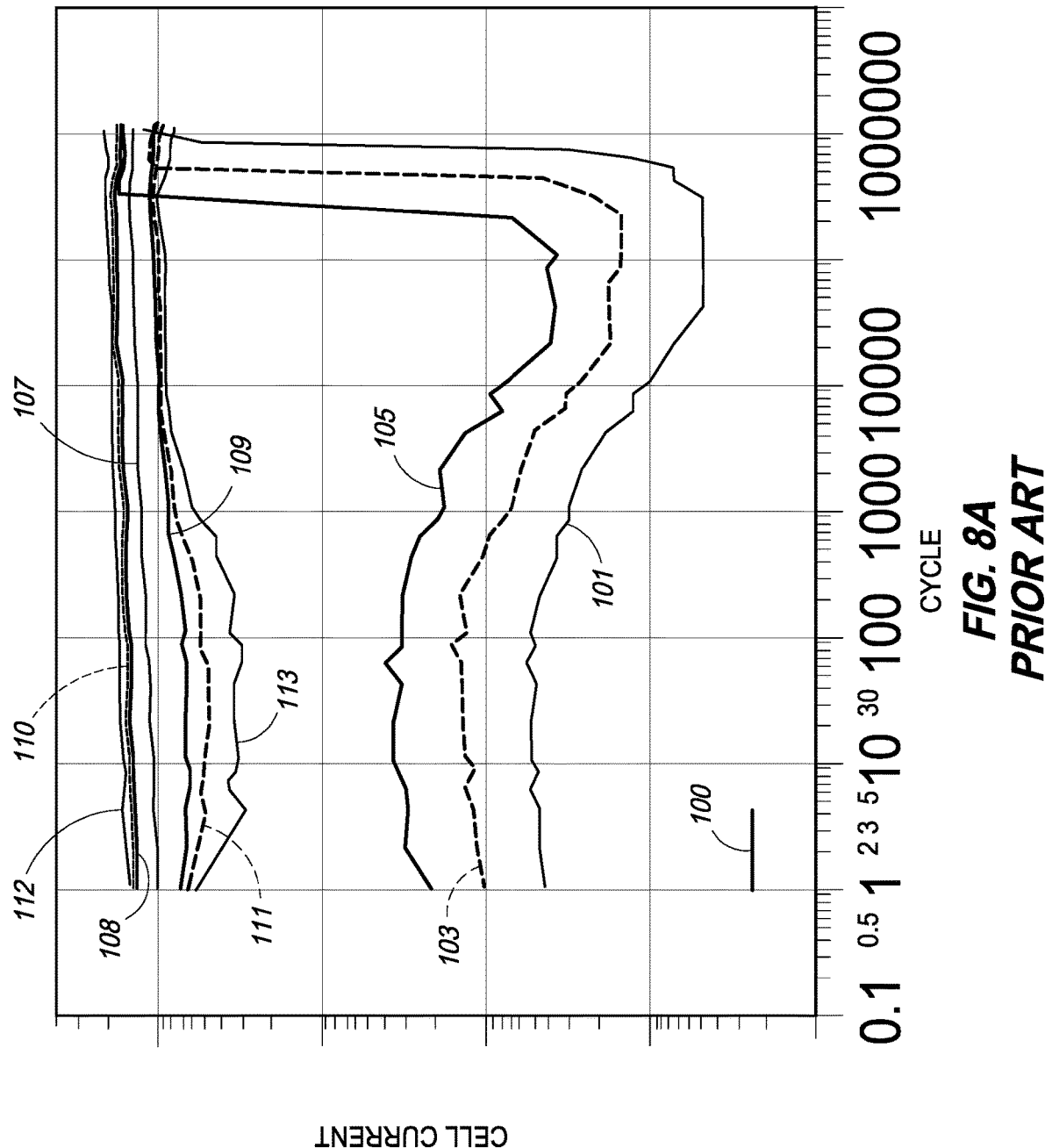
FIGS. 8A and 8B are graphical representations of cycling of a plurality of memory cells using a first group of pulses when a conventional single reset programming scheme of FIG. 1 is used.
Figure 8B:
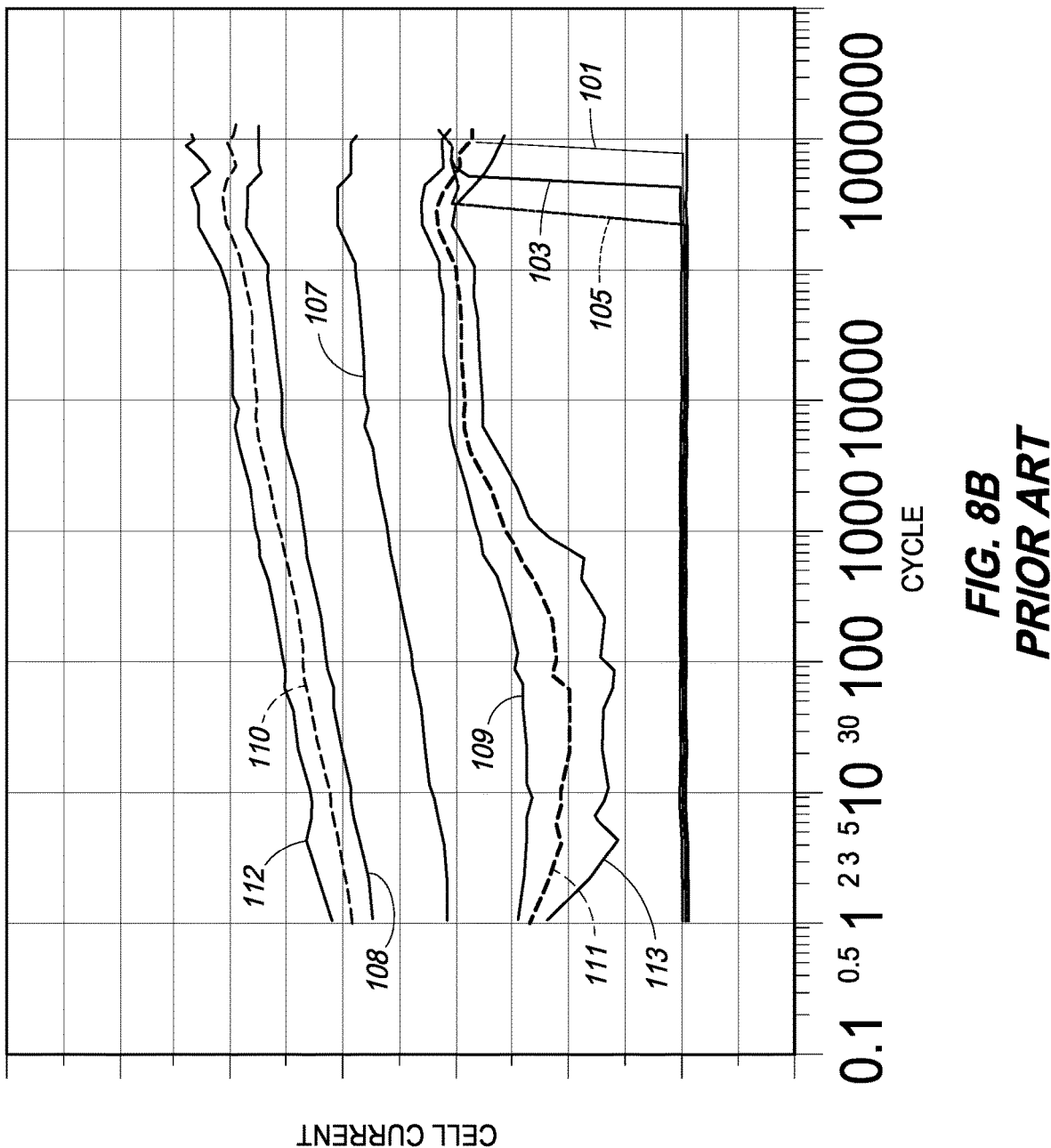

Referring to FIGS. 8A and 8B, graphical representations of conventional cycling of a plurality of memory cells using a first group of signals when a single conventional reset pulse programming scheme is used. FIGS. 8A and 8B represent cell current on the y axis and number of cycles on the x axis. In the illustrated example, 10 Kb CBRAM cells were cycled one million times using reset pulses of Vrst=2.3V, Vwl=5.5V and PW=300 ns where Vrst is the voltage applied to the bitlines of the cells, Vwl is the voltage applied to the wordlines of the cells and PW is the pulse width of the Vrst signal. The cells were programmed with set signals applied by the bitlines individually having a voltage of 5.0V, 35 uA current and pulse width of 300 ns.

In FIGS. 8A and 8B, lines 100-106 correspond to different groups of HRS cells with different sigma errors corresponding to the standard deviation of the distribution and lines 107-113 correspond to different groups of LRS cells with different sigma errors corresponding to the standard deviation of the distribution. For example, lines 100-106 represent the HRS cells with respective sigma errors: 0, 2, −2, 2.5, −2.5, 3 and −3 and lines 107-113 represent the LRS cells with respective sigma errors: 0, 2, −2, 2.5, −2.5, 3 and −3.

Figure 9A:
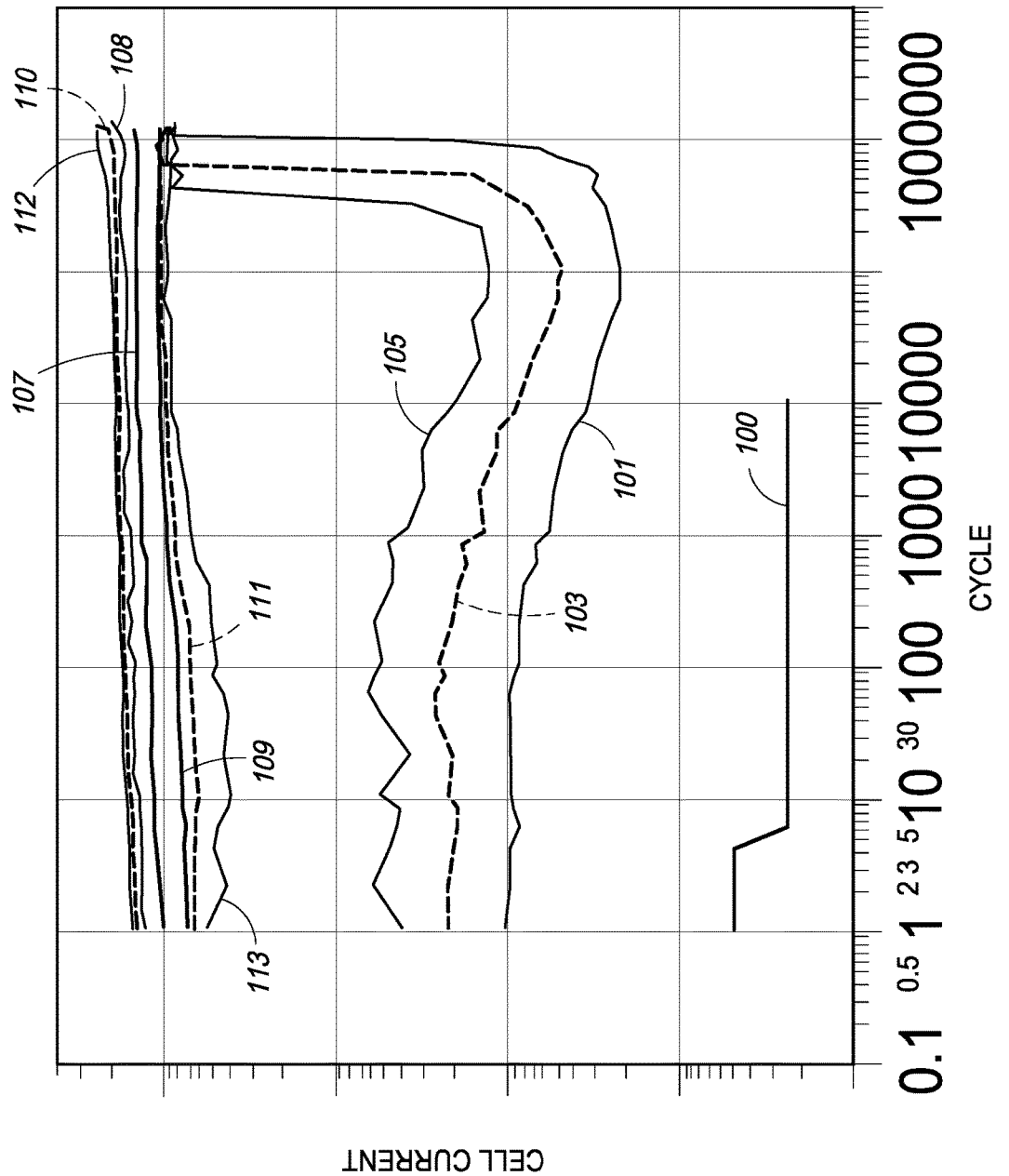
FIGS. 9A and 9B are graphical representations of cycling of a plurality of memory cells using a second group of pulses when a conventional single reset programming scheme of FIG. 1 is used.
Figure 9B:
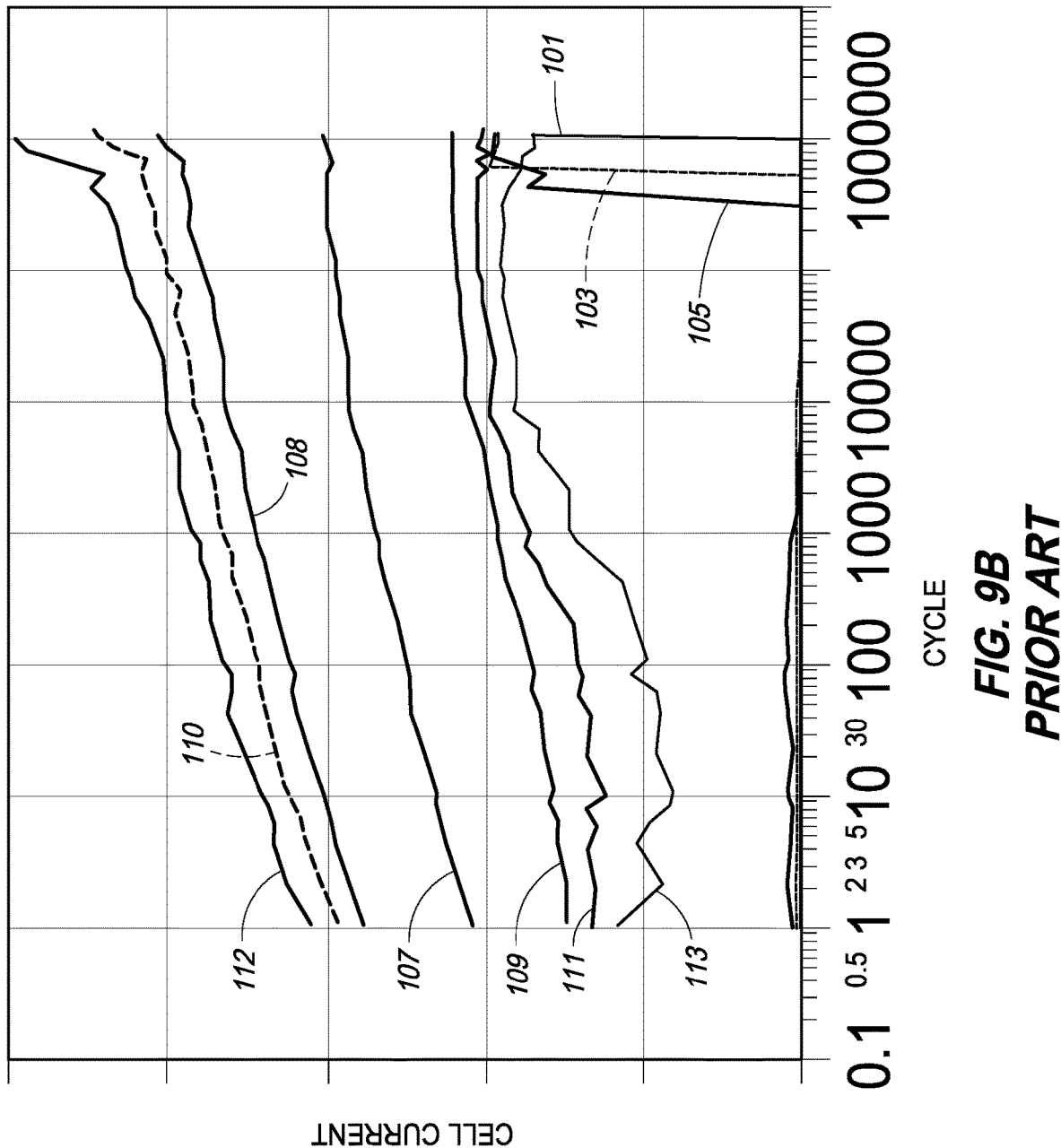

Referring to FIGS. 9A and 9B, graphical representations of cycling of a plurality of memory cells using a second group of signals are shown when the conventional single reset/set programming scheme is used. In the illustrated example, 10 Kb CBRAM cells were cycled one million times using reset pulses Vrst=2.0V, Vwl=8.0V and PW=300 ns where Vrst is the voltage applied to the bitlines of the cells, Vwl is the voltage applied to the wordlines of the cells and PW is the pulse width of the Vrst signal. The cells were programmed with set signals applied by the bitlines individually having a voltage of 5.0V, 35 uA current and pulse width of 300 ns.

The graphical representations of FIGS. 8A, 8B, 9A, and 9B show similar endurance fail at 300 k cycles using the conventional programming schemes.

Figure 10:
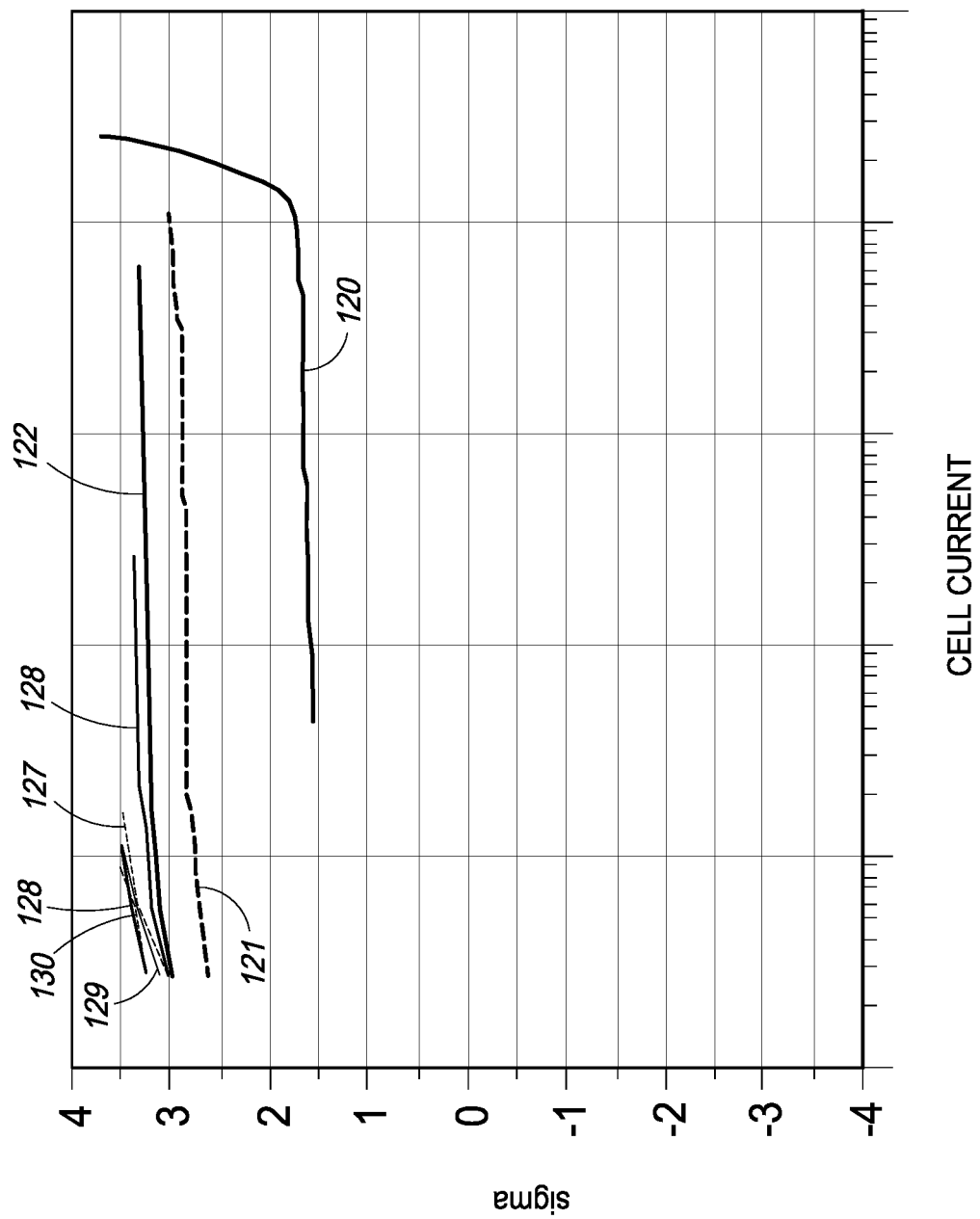
FIG. 10 is a graphical representation showing resetting of memory cells following cycling using the first group of pulses.

Referring to FIG. 10, the graphical representation shows resetting of memory cells using ten consecutive higher reset current pulses using Vrst=3.0V, Vwl=8.0V, and PW=300 ns following 1 million cycles of the memory cells using the first group of pulses.

Figure 11:
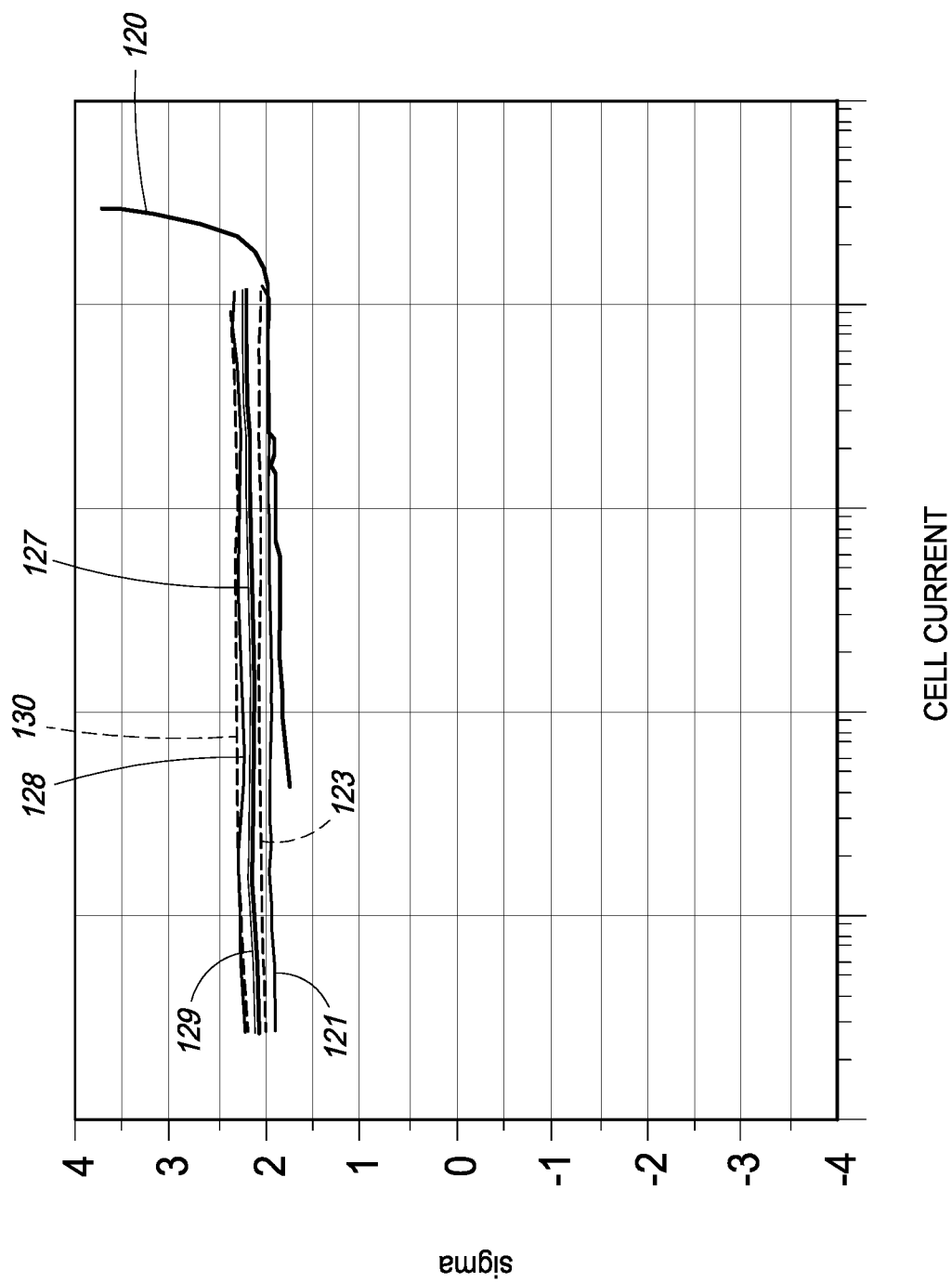
FIG. 11 is a graphical representation showing resetting of memory cells following cycling using the second group of pulses.

Referring to FIG. 11, the graphical representation shows resetting of memory cells using ten consecutive higher reset current pulses utilized in the resetting of FIG. 10 following 1 million cycles of the memory cells using the second group of pulses.

As shown in FIGS. 10 and 11, only memory cells previously cycled with the first group of signals were successfully reset as shown in FIG. 10 while the memory cells previously cycled with the second group of signals remain stuck in the low resistance state as shown in FIG. 11.

Figure 12A:
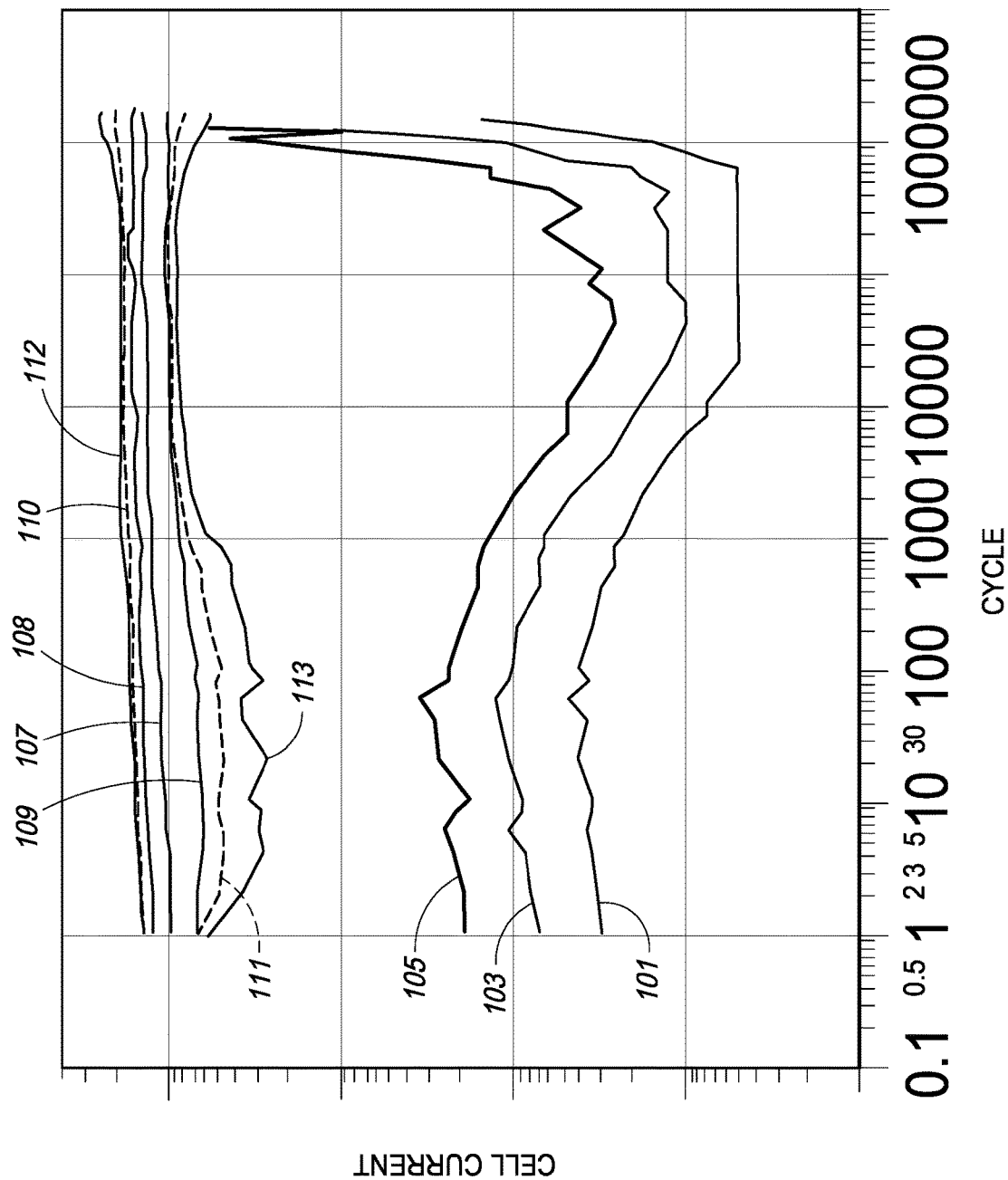
FIGS. 12A and 12B are graphical representations of pulse endurance when a ramped programming scheme is used according to one embodiment.
Figure 12B:
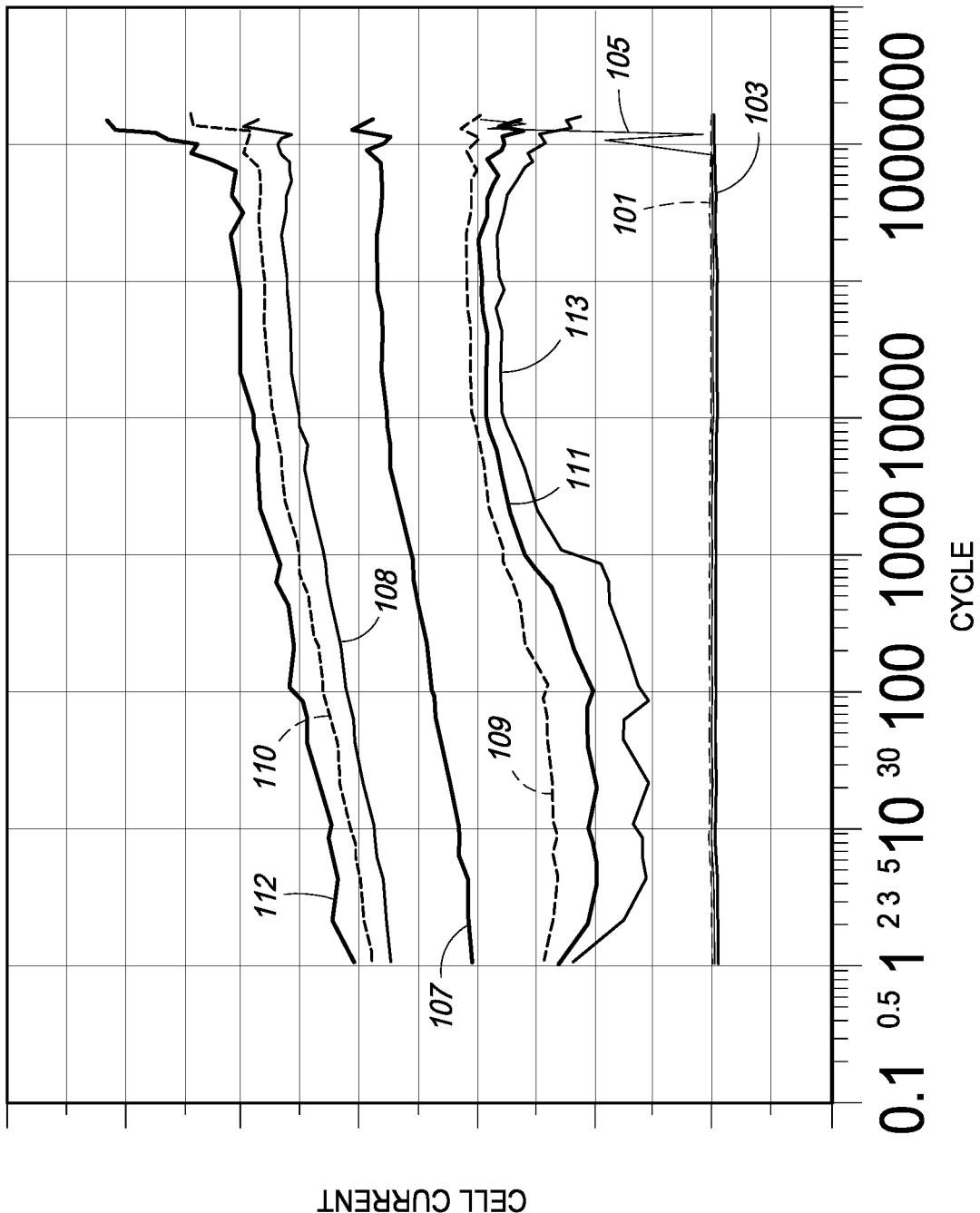

Referring to FIGS. 12A and 12B, graphical representations of cycling of the memory cells using ramped signals during a reset programming scheme is shown and may be compared with the single fixed pulse programming operations which results are shown in FIGS. 8A and 8B. In the illustrated example, the memory cells were cycled one million times using ramped pulses for reset operations as discussed above where the current of the reset pulse was increased if the cells failed to reset.

Figure 13:
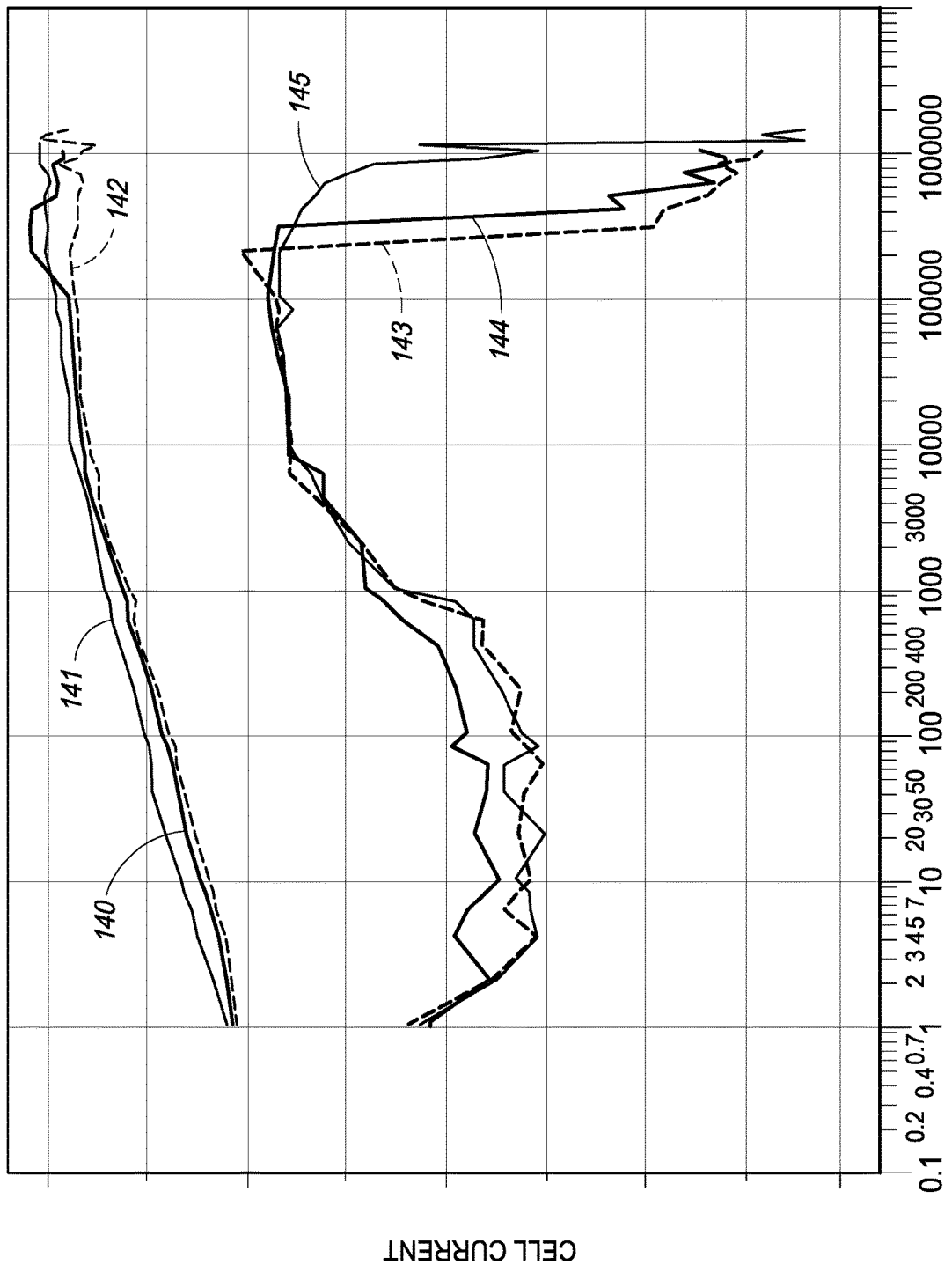
FIG. 13 is a graphical representation of a read window budget as a function of cycling.

Referring to FIG. 13, a read window budget (i.e., LRS-HRS) is shown as a function of cycling. In FIG. 13, lines 140-142 illustrate median (0 sigma error) for respective ones of: use of a single fixed pulses with Vwl=5.5V, use of single fixed pulses with Vwl=8V, and the ramped word line signals according to one embodiment. Lines 143-145 illustrate 3 sigma error for respective ones of: use of single fixed pulses with Vwl=5.5V, use of single fixed pulses with Vwl=8V, and the ramped word line signals according to one embodiment.

The use of the ramped word line signals according to one embodiment extends cell endurance with a positive read window budget beyond one million cycles while single pulse cycling fails 3 sigma at 300 k. The application of ramped signals according to one embodiment provides almost an extra decade of cycling as represented by line 142 compared with use of single pulses having fixed voltages for reset operations.

CONCLUSION

In some embodiments, a memory system comprises a memory array comprising a plurality of memory cells individually configured to have a plurality of different memory states, access circuitry configured to apply signals to the memory cells to program the memory cells to the different memory states, and a controller to configured to control the access circuitry to apply a first of the signals to one of the memory cells to program the one memory cell from a first memory state to a second memory state different than the first memory state, to determine that the one memory cell failed to place into the second memory state as a result of the application of the first signal, and to control the access circuitry to apply a second signal to the one memory cell to program the one memory cell from the first memory state to the second memory state as a result of the determination, wherein the first and second signals have a different electrical characteristic.

In some embodiments, a memory system comprises a memory array comprising a plurality of memory cells individually comprising a memory element configured to have different electrical resistances corresponding to a plurality of different memory states of the individual memory cell, and access circuitry coupled with the memory array and configured to apply a plurality of signals to the memory cells to program the memory cells into the different memory states, the access circuitry configured to apply one of the signals to one of the memory cells to change the electrical resistance of the one memory cell from one memory state to another memory state and to apply a plurality of the signals at a plurality of moments in time to another of the memory cells to change the electrical resistance of the another memory cell from the one memory state to the another memory state.

In some embodiments, a memory programming method comprises first applying a first signal to a memory cell to attempt to program the memory cell from a first memory state into a second memory state, determining that the memory cell failed to place in the second memory state as a result of the first applying, and after the determining, second applying a second signal to the memory cell to program the memory cell from the first memory state into the second memory state.

In some embodiments, a memory programming method comprises first applying a first signal to a memory cell to program the memory cell into a first memory state, the first applying forming an electrically conductive structure within a memory element of the memory cell providing the memory cell in a low resistance state corresponding to the first memory state, second applying a second signal to attempt to program the memory cell into a second memory state different than the first memory state, determining that the memory cell failed to place into the second memory state as a result of the second applying, and as a result of the determining, third applying a third signal to the memory cell to program the memory cell into the second memory state, the third applying removing the electrically conductive structure within the memory element providing the memory cell in a high resistance state corresponding to the second memory state.

In some embodiments, a memory programming method comprises identifying a plurality of memory cells of a memory array to be programmed into a first memory state, applying a plurality of first signals to the identified memory cells to attempt to program the identified memory cells into the first memory state, after the applying, determining that at least one of the identified memory cells failed to place into the first memory state, and as a result of the determining, applying a second signal to the at least one identified memory cell to program the at least one identified memory cell into the first memory state.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

What is claimed is:

1. A memory system comprising:
   a memory element configured to have different electrical resistances in different memory states;
   circuitry configured to provide a plurality of signals to the memory element to change the electrical resistance of the memory element from a first resistance corresponding to a first of the memory states to a second resistance corresponding to a second of the memory states;

wherein the memory element has the first resistance after the provision of a first of the signals to the memory element and the electrical resistance of the memory element changes from the first resistance to the second resistance as a result of the provision of a second of the signals to the memory element after the provision of the first signal to the memory element; and wherein the circuitry comprises an access transistor, and the circuitry is configured to increase a bias voltage applied to a gate of the access transistor during the provision of the second signal to the memory element compared with the bias voltage applied to the gate of the access transistor during the provision of the first signal to the memory element.

2. The system of claim 1 wherein the second signal has an increased electrical characteristic compared with the first signal.

3. The system of claim 2 wherein the increased electrical characteristic comprises increased current.

4. The system of claim 1 wherein the circuitry is configured to provide the second signal to the memory element as a result of the memory element having the first resistance following the provision of the first signal to the memory element.

5. A memory system comprising:
   a memory element configured to have different electrical resistances in different memory states;
   circuitry configured to:
      provide a first signal to the memory element to attempt to change the electrical resistance of the memory element from a first resistance corresponding to a first of the memory states to a second resistance corresponding to a second of the memory states;
      determine that the memory element failed to place in the second memory state having the second resistance after the provision of the first signal to the memory element; and
      after the determination, provide a second signal having a different electrical characteristic than the first signal to the memory element to attempt to change the electrical resistance of the memory element from the first resistance to the second resistance; and
   wherein the circuitry comprises an access transistor, and the circuitry is configured to increase a bias voltage applied to a gate of the access transistor during the provision of the second signal to the memory element compared with the bias voltage applied to the gate of the access transistor during the provision of the first signal to the memory element.

6. The system of claim 5 wherein the second signal has an increased electrical characteristic compared with the first signal.

7. The system of claim 5 wherein the second signal has an increased current compared with the first signal.

8. A memory system comprising:
   a memory element in a first memory state;
   circuitry configured to:
      provide a first control signal to an access circuit to provide a first program signal to the memory element to attempt to change the memory element from the first memory state to a second memory state;
      determine that the memory element did not change to the second memory state after the provision of the first program signal to the memory element; and
      after the determination, provide a second control signal to the access circuit to provide a second program signal to the memory element to attempt to change the memory element from the first memory state to the second memory state, wherein the first and second control signals have a different electrical characteristic; and
   wherein the provision of the second program signal to the memory element removes a conductive structure within dielectric material of the memory element changing the memory element from the first memory state to the second memory state.

9. The system of claim 8 wherein the access circuit comprises a transistor, and the circuitry is configured to provide the first and second control signals to a gate of the transistor.

10. The system of claim 9 wherein the second control signal has the different electrical characteristic comprising an increased voltage compared with a voltage of the first control signal.

11. The system of claim 8 wherein the memory element has different electrical resistances in the first and second memory states.

12. The system of claim 8 wherein the memory element has an increased electrical resistance in the second memory state compared with the first memory state.

13. The system of claim 8 wherein the second program signal has an increased electrical characteristic compared with the first program signal.

14. The system of claim 8 wherein the second program signal has an increased current compared with the first program signal.

15. A memory programming method comprising:
   first asserting a word line to select at least one of a plurality of memory cells;
   during the first asserting, first providing a first current to a memory element of the at least one memory cell to attempt to change the at least one memory cell from a first memory state to a second memory state;
   determining that the at least one memory cell is in the first memory state after the first providing;
   after the determining, second asserting the word line to select the at least one memory cell;
   during the second asserting, second providing a second current to the memory element of the at least one memory cell to attempt to change the at least one memory cell from the first memory state to the second memory state;
   wherein the second current is larger than the first current; and
   wherein the second providing removes a conductive structure within dielectric material of the memory element changing the at least one memory cell from the first memory state to the second memory state.

16. The method of claim 15 wherein the memory cells individually have different electrical resistances in the first and second memory states.

17. The method of claim 15 wherein the second asserting provides an increased voltage to an access circuit compared with a voltage provided to the access circuit during the first asserting.

18. The method of claim 17 wherein the access circuit comprises a transistor, and the providings of the voltages to the access circuit during the first and second assertings individually comprise providing to a gate of the transistor.

19. The system of claim 1 wherein the memory element is a first memory element, and further comprising a plurality of additional memory elements, and wherein the first memory element and the additional memory elements are individually coupled with a common conductor.

20. The system of claim 1 wherein the memory element only has two different memory states and only two resistances corresponding to respective ones of the two different memory states.

21. The system of claim 1 wherein the memory element is configured to store a single bit of information.

22. The system of claim 8 wherein the common conductor comprises an electrode of each of the first and additional memory elements.

23. The method of claim 15 wherein the common conductor comprises the electrode of each of the memory cells.

24. The system of claim 8 wherein the memory element comprises a source layer adjacent to the dielectric material and the conductive structure comprises material of the source layer.

25. The method of claim 15 wherein the memory element comprises a source layer adjacent to the dielectric material and the conductive structure comprises material of the source layer.

26. The system of claim 1 wherein the provision of the second signal to the memory element removes a conductive structure within dielectric material of the memory element changing the memory element from the first memory state to the second memory state.

27. The system of claim 5 wherein the provision of the second signal to the memory element removes a conductive structure within dielectric material of the memory element changing the memory element from the first memory state to the second memory state.

* * * * *